(12) United States Patent
Shabany et al.

(10) Patent No.: US 8,257,156 B2
(45) Date of Patent: Sep. 4, 2012

(54) INCREASING AIR INLET/OUTLET SIZE FOR ELECTRONICS CHASSIS

(75) Inventors: Younes Shabany, San Jose, CA (US); Hans Yum, Santa Clara, CA (US); Todd Collis, Hoffman Estates, IL (US); Steve Bisbikis, Hawthorn Woods, IL (US); Steve Koo, Chicago, IL (US); Kieran Miller, Santa Clara, CA (US)

(73) Assignee: Flextronics AP, LLC, Broomfield, CO (US)

( * ) Notice: Subject to any disclaimer, the term of this patent is extended or adjusted under 35 U.S.C. 154(b) by 1166 days.

(21) Appl. No.: 11/688,733

(22) Filed: Mar. 20, 2007

(65) Prior Publication Data

US 2007/0217157 A1 Sep. 20, 2007

Related U.S. Application Data

(60) Provisional application No. 60/743,582, filed on Mar. 20, 2006.

(51) Int. Cl.
*H05K 5/00* (2006.01)
*H05K 7/20* (2006.01)

(52) U.S. Cl. ........................................ 454/184; 361/695
(58) Field of Classification Search .................. 454/184; 361/695
See application file for complete search history.

(56) References Cited

U.S. PATENT DOCUMENTS

| | | | |
|---|---|---|---|
| 3,874,444 A * | 4/1975 | Perce et al. .................. | 165/47 |
| 4,672,509 A | 6/1987 | Speraw | |
| 4,758,925 A * | 7/1988 | Obata et al. ................... | 361/695 |
| 5,063,477 A * | 11/1991 | Paggen et al. ................. | 361/695 |
| 5,995,368 A * | 11/1999 | Lee et al. ....................... | 361/695 |
| 6,283,850 B1 * | 9/2001 | Toshimitsu et al. ........... | 454/184 |
| 6,594,148 B1 * | 7/2003 | Nguyen et al. ................ | 361/695 |
| 6,625,020 B1 * | 9/2003 | Hanson et al. ................ | 361/695 |
| 6,813,149 B2 | 11/2004 | Faneuf et al. | |
| 6,813,152 B2 * | 11/2004 | Perazzo ......................... | 361/695 |
| 6,912,129 B2 * | 6/2005 | Baker et al. ................... | 361/695 |
| 7,085,133 B2 * | 8/2006 | Hall .............................. | 361/695 |
| 7,259,961 B2 * | 8/2007 | Lucero et al. ................. | 361/695 |
| 7,283,359 B2 * | 10/2007 | Bartell et al. ................. | 361/695 |
| 7,316,606 B2 * | 1/2008 | Shipley et al. ................ | 454/184 |
| 7,394,654 B2 * | 7/2008 | Zieman et al. ................ | 361/695 |
| 7,508,664 B2 * | 3/2009 | Holland ........................ | 361/695 |
| 2005/0024825 A1 * | 2/2005 | Smith et al. ................... | 361/687 |
| 2005/0276017 A1 | 12/2005 | Aziz et al. | |
| 2006/0223433 A1 * | 10/2006 | Matsuzawa et al. .......... | 454/184 |

* cited by examiner

*Primary Examiner* — Steven B McAllister
*Assistant Examiner* — Frances H Kamps
(74) *Attorney, Agent, or Firm* — Marsh Fischmann & Breyfogle LLP

(57) ABSTRACT

Provided are electronics chassis having air inlets with increased cross-sectional area that facilitate airflow through the chassis and thereby provide improved cooling. As electronics chassis are often stacked, it has been determined that the upper surfaces of a lower chassis may be utilized to at least partially define the air inlet of the upper chassis. In this regard, an upper portion of the lower chassis may be removed to increase the size of an air inlet. That is, portions of an upper wall and/or the top wall of a lower chassis are removed and connected by a connecting wall (e.g. a tapered and/or a chamfered wall). Likewise, the bottom wall of an upper chassis may be removed. When stacked, the air inlet of the upper chassis may be disposed above the truncated portion of the lower chassis. In such an arrangement, the size of the resulting air intake is significantly increased.

8 Claims, 7 Drawing Sheets

INCREASING AIR INLET/OUTLET SIZE FOR ELECTRONICS CHASSIS

CROSS-REFERENCE TO RELATED APPLICATION

This application claims priority under 35 U.S.C. 119 to U.S. Provisional Application No. 60/743,582, entitled: "INCREASING AIR INLET/OUTLET SIZE FOR ELECTRONICS CHASSIS," filed on Mar. 20, 2006, the contents of which are incorporated herein as if set forth in full.

BACKGROUND

Modern electronics, such as telecommunications equipment, is commonly contained in a housing or chassis. The chassis may serve many functions, including providing structural support for the contents, providing a common electrical ground, providing protection from electromagnetic interference (EMI), and others.

For many applications (e.g., telecommunications centers, server farms, etc.) it has is become common practice to stack multiple individual electronics chassis in specialized racks. Further, multiple racks may be arranged in a side-by-side manner. These arrangements allow for reducing the space required to house multiple such electronics chassis.

Within certain industries, there are standards organizations that have promulgated specifications for certain types of electronics chassis. One example of such an organization is the PCI Industrial Computer Manufacturers Group (PICMG) and an example of such a specification is PICMG 3.0 Rev. 1.0 or as further updated, more commonly known as the Advanced Telecom Computing Architecture (ATCA) specification.

Along with voluminous other requirements, the ATCA specification specifies the mechanical configuration of a backplane within a housing, the number, size, and relative spacing of circuit boards (referred to as blades) that are retained within the housing and which electrically connect to the backplane. The ATCA specification also specifies the characteristics of the circuit ground provided for the blades, and the cooling and air filtering requirements for the housing.

Although the ATCA has provided a significant improvement with respect to providing standardized component interfaces and operability, several of the design specifications have failed to account for the growth in the processing speed and density of electronics board. For instance, processing speeds of the equipment housed by the chassis has increased faster than anticipated by the ATCA. Further, there is a direct relationship between speed and power consumption; the faster the processor speed the higher the power consumption of the processor. Accordingly, continued growth in processing speeds and/or electronics density results in the need to dissipate a greater amount of heat by an ATCA chassis It is against this background that the present invention has been developed.

SUMMARY

In view of the foregoing, various systems and methods (i.e., utilities) are provided herein for improving airflow through electronics chassis including, without limitation, ATCA chassis. Generally, a lower portion of a first surface (e.g., a front surface) of a chassis may include an air inlet and an upper portion of an opposing surface (e.g., a back surface) of the chassis may include an air outlet. In such an arrangement, the upper portion of the front surface of the chassis may be truncated to provide improved airflow into an air inlet on the front and bottom surfaces of a chassis disposed on top of the truncated chassis.

In a first aspect, an electronics chassis is provided for housing a plurality of circuit boards that allows for increasing the size of an air inlet opening thereto. The housing includes four vertical sidewalls, including first and second lateral sidewalls, a back wall and a front wall. These walls define an interior of the housing, which includes an upper plenum, a lower plenum and a section disposed between the plenums for receiving a plurality of electronics boards. A top wall extends over a portion of the area defined by the four vertical sidewalls. In this regard, the top wall may form an upper surface of the upper plenum. To increase the size of the air inlet, the top wall does not extend over the entirety of the area defined by the four vertical sidewalls. Rather, a connecting wall extends between the top wall and the front wall where the connecting wall is at least partially transverse to both the top wall and the front wall.

The top wall may extend over a portion of the area defined by the four vertical sidewalls. For instance, the top wall may extend from the back wall towards the front wall. In such an arrangement, the connecting wall may extend between an edge of the top wall and an edge of the front wall. In one arrangement, a connecting wall may be a planar surface. In another arrangement, the connecting wall may be a curved surface. In one arrangement, the top wall may be a substantially horizontal (i.e., in relation to the vertical sidewalls) surface. Further, the top wall may be conformal with the top edges of the lateral sidewalls and/or back wall. Alternatively, the top wall may be disposed a predetermined distance from the top edges of these walls. The lateral sidewalls may be substantially continuous between the front and rear walls such that they provide an upper edge that may be utilized to support a chassis thereon.

The chassis may include one or more fan units that are utilized to displace air through the chassis. In one arrangement, one or more fan units may be disposed adjacent to an air outlet in the upper plenum. Such fan units may be disposed upright such that they are substantially parallel to the vertical surfaces defined by the sidewalls. In another arrangement, one or more fan units may be disposed in the upper plenum above electronics cards within the housing. In such an arrangement, the fan units may be disposed horizontally (i.e., perpendicular to the vertical sidewalls). In further arrangements, the fan units may be disposed in the lower plenum, either vertically and/or horizontally.

In one arrangement, the chassis is free of a bottom wall. In this regard, when a chassis free of a bottom wall is disposed on top of another chassis (e.g., having a truncated upper plenum), there is no bottom wall to impede airflow there into the chassis.

According to another aspect, an electronics chassis is provided. The chassis includes four vertical sidewalls, including first and second lateral sidewalls, a back wall and a front wall. An air outlet is disposed through the back wall. A top wall extends between the lateral sidewalls and between the front and back walls. The top wall connects to the back wall at a first distance is relative to a top edge of the lateral sidewalls and connects to the front wall at a second distance relative to the top edge of the lateral sidewalls. In this arrangement, the second distance is greater than the first distance. In this regard, the top wall is interconnected to the wall having the air outlet (i.e., back wall) at a location that is above the location where the top wall interconnects to the opposing wall (i.e. front wall). That is, one end of the top wall is lower than the other end of the top wall.

In one arrangement, the top wall slopes between the front and back walls. Accordingly, this sloping surface may be a planar surface. In this arrangement, the lower end of the top wall may provide additional space to allow increasing the size of air inlet opening of a chassis disposed above the top wall. In another arrangement, the top wall includes a first section connecting to the back wall and a chamfered section connecting to the front wall. The first section and the chamfered section may define surfaces that are transverse. In this regard, the first section may form, for example, a horizontal surface and the chamfered section may define an angled, curved or other surface that extends between the first section of the top wall and the front wall. Again, the chassis may be free of a bottom wall.

According to another aspect an electronics chassis is provided for housing a plurality of electronics boards. The chassis includes an enclosure having first and second lateral sidewalls, a back wall and a front wall. The chassis also includes upper and lower plenums. The lower plenum is disposed below the enclosure and the upper plenum is disposed above the enclosure. The lower plenum includes an air inlet on a front surface associated with the front wall of the enclosure and the upper plenum includes an air outlet on a rear surface associated with the back wall. The upper plenum also includes side surfaces, a chamfered surface associated with the front wall of the enclosure and a top surface extending between the rear surface and the is chamfered surface.

The chamfered surface is typically transverse to both the front wall and the top surface. In the present aspect, portions or the entirety of the side surfaces and/or rear surface of the upper plenum may be formed by the lateral sidewalls and back wall of the enclosure, respectively. Alternatively, the surfaces may be formed separately form the walls of the enclosure.

The foregoing examples of the related art and limitations related therewith are intended to be illustrative and not exclusive. Other limitations of the related art will become apparent to those of skill in the art upon a reading of the specification and a study of the drawings.

BRIEF DESCRIPTION OF THE DRAWINGS

Exemplary embodiments are illustrated in referenced figures of the drawings. It is intended that the embodiments and figures disclosed herein be considered illustrative rather than limiting.

DETAILED DESCRIPTION

Figure 1:
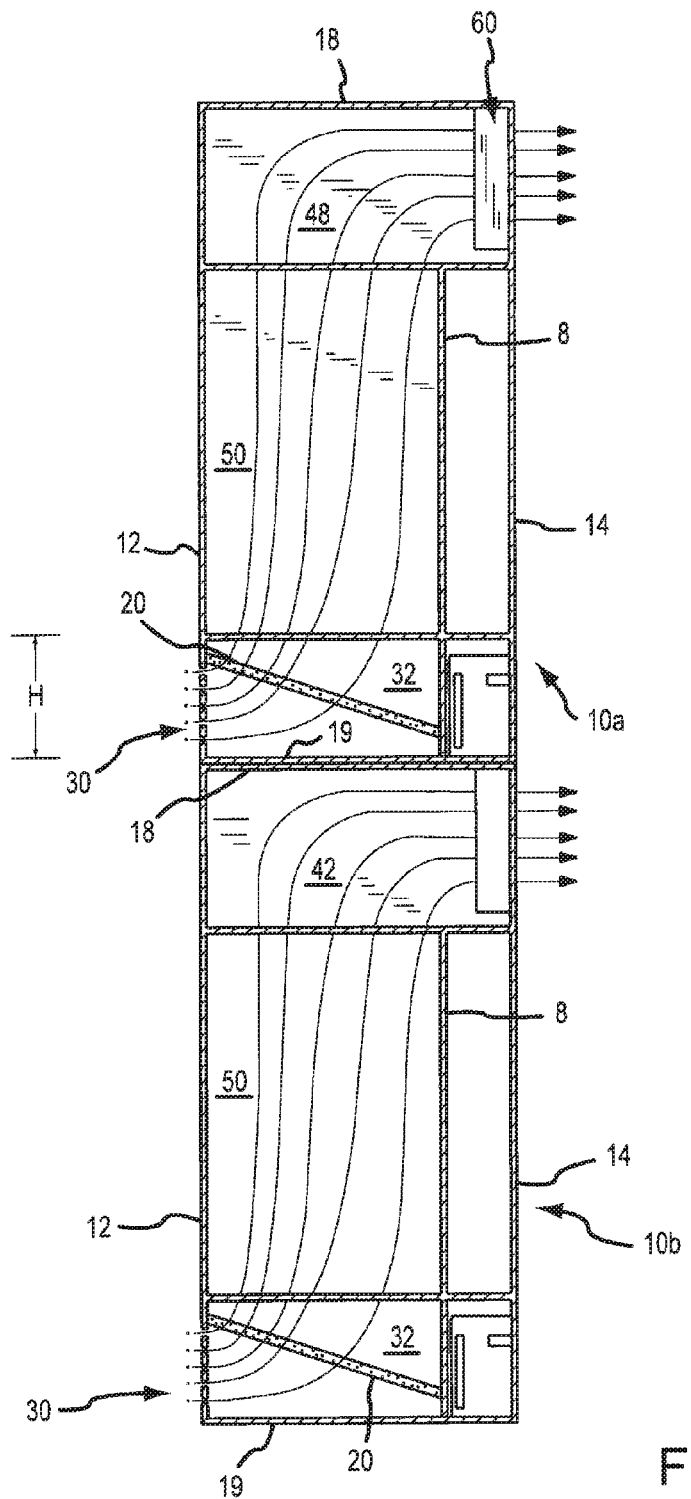
FIG. 1 is a cut-away side view of portions of a prior art pair of stacked electronics chassis.

Reference will now be made to the accompanying drawings, which assist in illustrating the various pertinent features of the present invention. Although the present invention will now be described primarily in conjunction with electronics chassis, it should be expressly understood that the present invention may be applicable to other applications where it is desired to achieve the objectives of the inventions contained herein. In this regard, the following description of an electronics chassis is presented for purposes of illustration and description. Furthermore, the description is not intended to limit the invention to the form disclosed herein. Consequently, variations and modifications commensurate with the following teachings, and skill and knowledge of the relevant art, are within the scope of the present invention. The embodiments described herein are further intended to explain modes known of practicing the invention and to enable others skilled in the art to utilize the invention in such, or other embodiments and with various modifications required by the particular application(s) or use(s) of the present invention.

FIGS. 1-7 variously illustrate cross-sectional side and perspective views of an exemplary electronics chassis 10. Generally, the chassis 10 conform to ATCA specifications and include an enclosure having four vertical sidewalls that house a plurality of electronic boards or "blades." See for example FIG. 3. Specifically, the chassis 10 includes a front wall 12, a back wall 14, two lateral sidewalls 16, as well as a top wall 18. The chassis 10 may be composed of any suitable material including, but not limited to, plastic, steel and aluminum. Further, the physical dimensions of the chassis 10 may also vary according to intended use and/or chassis specific specifications.

The chassis 10 typically houses a plurality of electronic circuit cards, also known as blades. For instance, the chassis may house a plurality of blades 50 (e.g., sixteen blades) that are disposed in parallel fashion and extend from the front wall 18 towards a backplane 8 within the chassis 10 that is spaced from the back wall 14 (See FIGS. 2 and 3). In another dimension, the blades generally extend vertically from the top of a lower plenum 32 to the bottom of an upper plenum 42. Further, it will be appreciated that the blades 50 are spaced relative to one another such that air may flow between each individual board for cooling purposes. However, it will be appreciated that the exact configuration of the chassis 10 may vary by application.

The blades within the chassis 10 generate heat during operation and are cooled by air flowing through the chassis 10. In some instances, such airflow may be due to natural convection within the electronics chassis 10. More commonly, one or more fan units 60 are utilized to displace air through the electronics chassis for cooling purposes. In this regard, the fan units 60 may be operative to displace ambient air through an inlet 30, into a lower plenum 32, through one or more filters 20, vertically between the blades into an upper plenum 42 and out of the chassis 10. As the air passes across components on the blades, heat is carried away. Often, the lower plenum 32 includes a slanted filter 20, which is operative to at least partially distribute airflow along the length of the blades such that more even airflow is achieved.

As noted, the ATCA chassis 10 includes a housing having a front wall 12, a back wall 14, and a pair of lateral sidewalls 16 that are sized to houses a plurality of telecommunication circuit boards/cards/blades. Also contained within the housing may be circuitry for power interface and distribution, for control of fans, and for management of all of the other circuitry within the is housing. It is a common practice to stack multiple chassis to reduce the amount of room required to house a plurality of such chassis. Further, it will be noted that multiple sets of stacked chassis may be disposed side by side.

Often, the only available surfaces for inletting and exhausting air for cooling purposes are the front and rear walls of the individual electronics chassis.

FIG. 1 illustrates a pair of prior art chassis 10a and 10b (referred to generally as chassis 10 unless specifically identified) that are stacked on top of one another. Specifically, FIG. 1 shows a cross-sectional side view for purposes of illustration. As shown, fan units 60 are operative to draw air through the chassis. As shown, ambient air enters the chassis 10 near the bottom wall 19 or "shelf" through the inlet 30, which may include a grate. The air enters the lower plenum 32, turns 90 degrees upward, flows across and between the blades 50, enters the upper plenum 42, again turns 90 degrees and flows through the fan unit(s) 60 and is exhausted from the chassis 10. In the embodiment shown, the lower plenum 32 includes a slanted filter 20, which is operative to at least partially distribute airflow along the length of the blades 50 such that more even airflow is achieved.

As shown, the air inlet 30 of the upper chassis 10a has a maximum height dimension H, as measured between the lower edge of the front wall 12 and the bottom wall 19 of the chassis 10a and/or the top wall 18 of the lower chassis 10b disposed immediately there below. As will be appreciated, this height, H, multiplied by the width W of the chassis 10a defines the cross-sectional area of the air inlet 30. This cross-sectional area limits the amount of airflow that may be drawn into the chassis 10a.

Accordingly, it may be desirable to increase the cross-sectional area of the air inlet in order to facilitate improved airflow through a chassis and thereby provide improved cooling. That is, a larger air inlet may reduce the resistance to airflow there through and thereby improve is cooling of the blades disposed within a chassis. However, it will be appreciated that in many instances, it may not be feasible to increase the size of the inlet 30 if this requires reducing the size of the front wall 12. That is, the lower edge of the front wall 12 typically extends least to the top edge of the lower plenum 32. In this regard, it is typical for the front wall 12, back wall 14 and lateral sidewalls 16 to be continuous over the portion of the chassis 10 that includes the blades 50. That is, the walls define a continuous housing between the upper and lower plenums 32, 42. This allows the front and back walls 12, 14 as well as the lateral side walls 16 to provide EMI shielding as well as provide an enclosure through which one or more fan units 60 may direct airflow for cooling purposes. That is, it may not be feasible to raise the lower edge of the front wall 12 and it is not desirable (or permitted by one or more standards) to increase the overall size of the chassis to increase the size of the air inlet. Accordingly, another technique to increase the size of the inlet has been developed.

Figure 2:
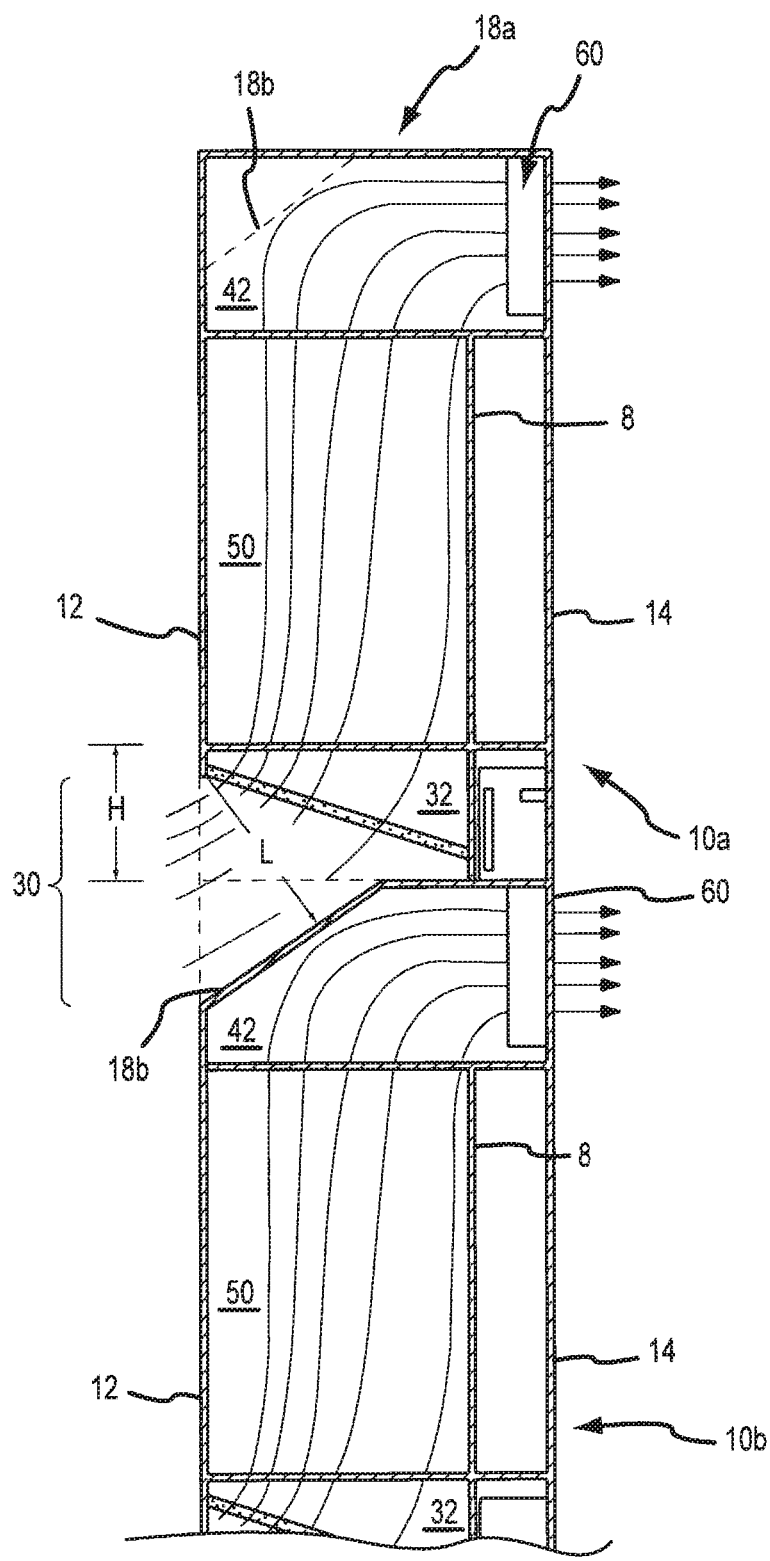
FIG. 2 is a cut-away side view of portions of a of stacked electronics chassis defining an air inlet having an increased size.

Specifically, as first and second stacked chassis 10a and 10b may collectively define the air inlet 30 of an upper chassis 10a, it has been determined that a portion of the upper plenum 42 and/or the top and front walls of the chassis may be removed to increase the size of an air inlet. That is, portions of the upper front wall 12 and/or the top wall 18 of a chassis 10a may be truncated and connected by a connecting wall (e.g. a tapered and/or a chamfered wall). This may be performed in conjunction with the removal and/or truncation of the bottom wall 19 of an upper chassis. In this regard, an upper chassis 10a having at least a portion of its bottom wall removed may be disposed above the truncated/chamfered portion of a lower chassis 10b. Accordingly, this allows effectively increases the size of the air inlet 30 of an upper chassis 10a FIG. 2 shows a pair of chassis 10a and 10b stacked on top of each other wherein the chassis each include an upper plenum 42 having a truncated portion (e.g., truncated front and top is walls) that allows for increasing the size of the air inlet 30 of a chassis disposed there above. As can be seen, each chassis 10 includes an air inlet in a lower front portion thereof and an air outlet formed in a rear portion thereof. Further, each chassis 10 includes a top wall 18 having a chamfered portion. Each chassis also has an air filter 20 disposed at a sloped angle near the inlet plenum. Further, each chassis 10 also includes a bank of one or more fan units 60s disposed proximate to its air outlet. As can be appreciated, the fan units exhaust air through the air outlet and thereby draw fresh air in through the air inlet 30, through the air filter 20, and into the interior of the housing where it removes heat from the various electronic circuitry therein. The air then enters the upper plenum 42 and is exhausted by the fans through the air outlet.

The size of the air inlet is increased by removing a portion of the upper plenum 42 of a chassis 10b. That is, a portion of a lower chassis 10b is removed in order to increase the size of the air inlet 30 of an upper chassis 10a. As shown, in such an arrangement the top edge of the front wall 12 does not reach to the upper edges of the lateral side walls 16. Likewise, the top wall 18 of the chassis 10 extends over a portion of less than all of the area projected by the planes of the front, back and lateral side walls 16. In this regard, the top wall 18 may have a generally horizontal portion/surface 18a and a chamfered portion/surface 18b. Such a chamfered portion 18b may extend between the horizontal portion 18a of the top wall 18 and the top edge of the front wall 12. It should be noted that the lateral side walls 16 may not be chamfered. In this regard, the side walls 16 may provide a continuous support surface between the planes defined by the front and back walls 12, 14 for supporting the lower edges of an upper chassis 10a.

In order to increase the size of the air inlet, the chassis 10 may also be free of a bottom wall. Alternatively, the chassis may include a bottom wall, which extends over less that an entirety of a projected area defined by the front wall, back wall and lateral side walls 16. For is instance, a bottom wall may be incorporated that substantially matches the horizontal portion 18a of the top wall 19.

Figure 3:
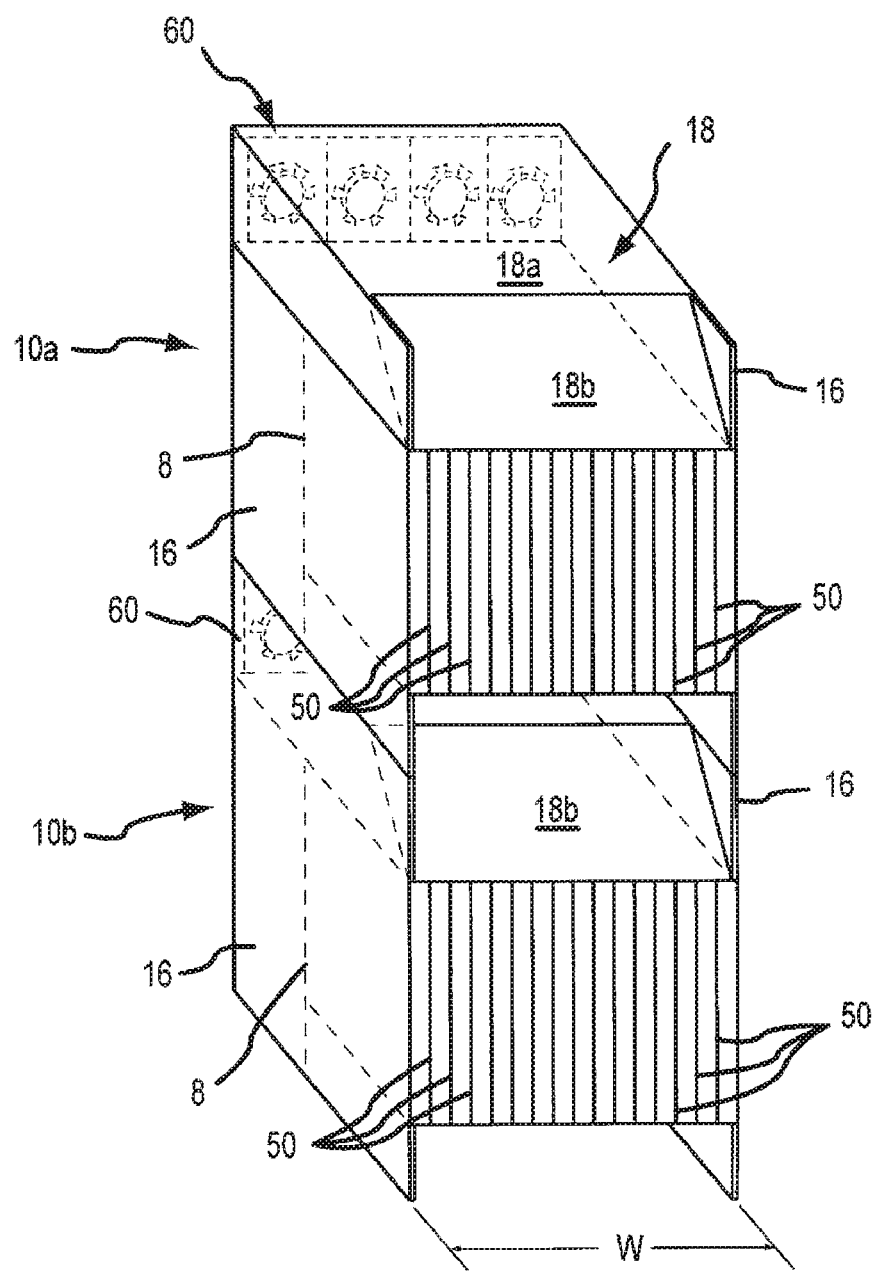
FIG. 3 is a perspective view of the stacked chassis of FIG. 2.

As can be seen by the examination of FIGS. 2 and 3, the size of the air inlet is greatly increased by the inclusion of the chamfered/truncated portion on a lower chassis 10b and the lack of a corresponding bottom wall on an upper chassis 10a. For instance, as shown in FIG. 2, a minimal cross-dimension of the air inlet 30 is defined by the distance L measured between the surface of the chamfered portion 18b of the top wall 18 and the lower edge of the front wall 12 of the upper chassis. As shown, this distance, L, is significantly greater than the corresponding height H shown in FIGS. 1 and 2. Accordingly, as the length L can be significantly increased in relation to the height H of existing air inlets, the cross-sectional area of the air inlet may be greatly increased.

Figure 4:
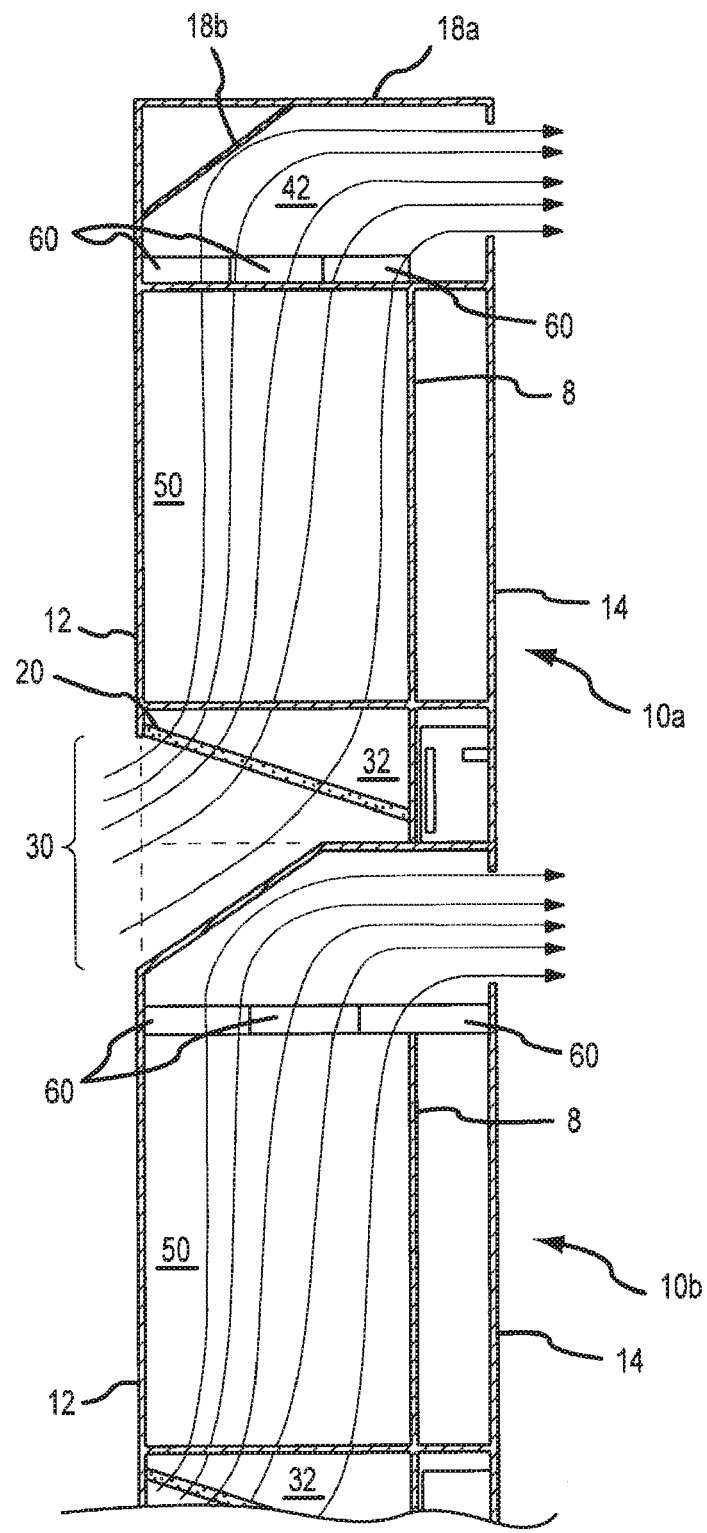
FIG. 4 is a cut-away side view of portions of another embodiment of stacked electronics chassis defining an air inlet having an increased size.
Figure 5:
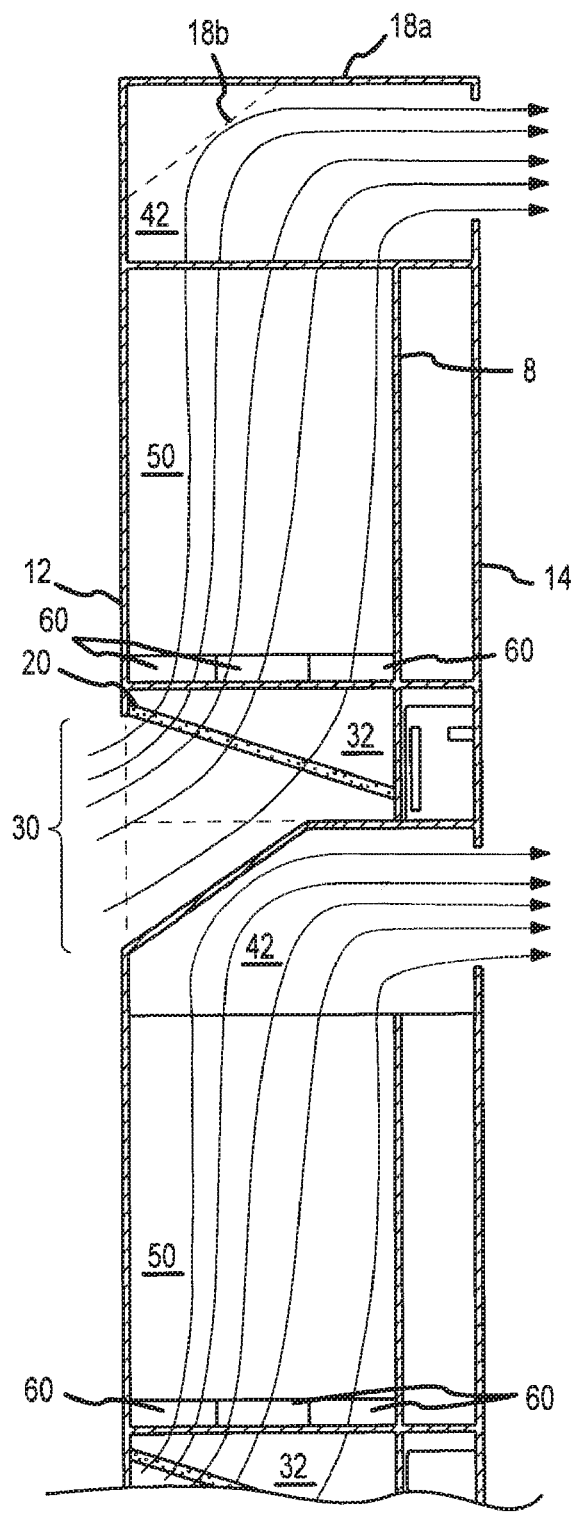
FIG. 5 is a cut-away side view of portions of another embodiment of stacked electronics chassis defining an air inlet having an increased size.

FIGS. 2, 4 and 5 illustrate different embodiments of the chassis where the fan unit(s) 60 are disposed at different locations within the chassis 10. For instance, in FIG. 2, the fan units 60 are disposed in a vertical relationship adjacent to an exhaust outlet of the chassis 10. In FIG. 4, one or more fan units 60 are horizontally disposed in the upper plenum 42 above the portion of the chassis that contains the blades 50. In the further embodiment of FIG. 5, the fan units 60 are disposed in the lower plenum 32 below the blades 50 disposed within the chassis 10. In these various different arrangements, the fan units 60 are operative to draw and/or push air through the chassis 10. In addition, it will be appreciated that different chassis may utilize different combinations of these fan arrangements. Further, such fan arrangements may include those set forth in U.S. application Ser. No. 11/383,153, entitled "Airflow Management System for Electronics Chassis" having a filing date of Mar. 12, 2006, the entire contents of which are incorporated by reference herein.

Figure 6:
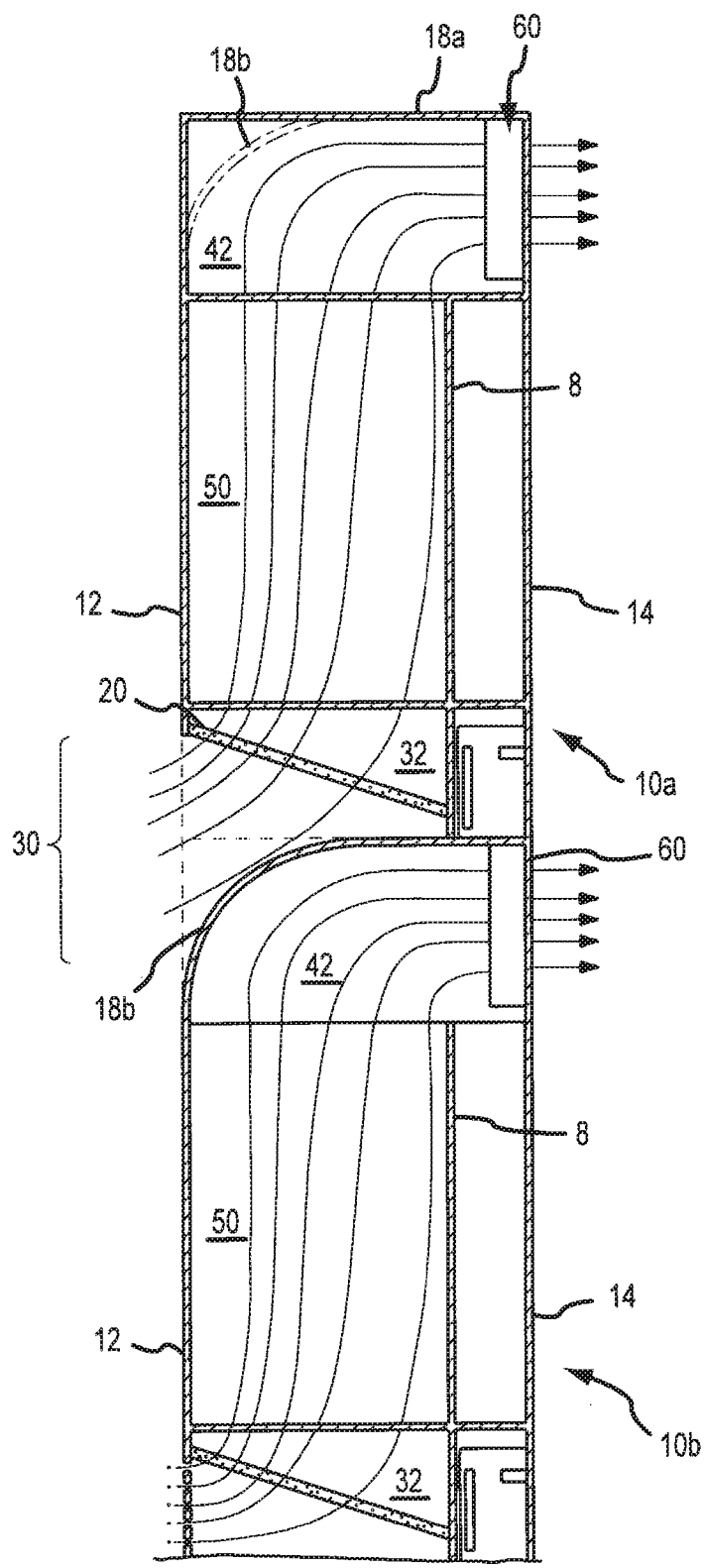
FIG. 6 is a cut-away side view of portions of another embodiment of stacked is electronics chassis defining an air inlet having an increased size.
Figure 7:
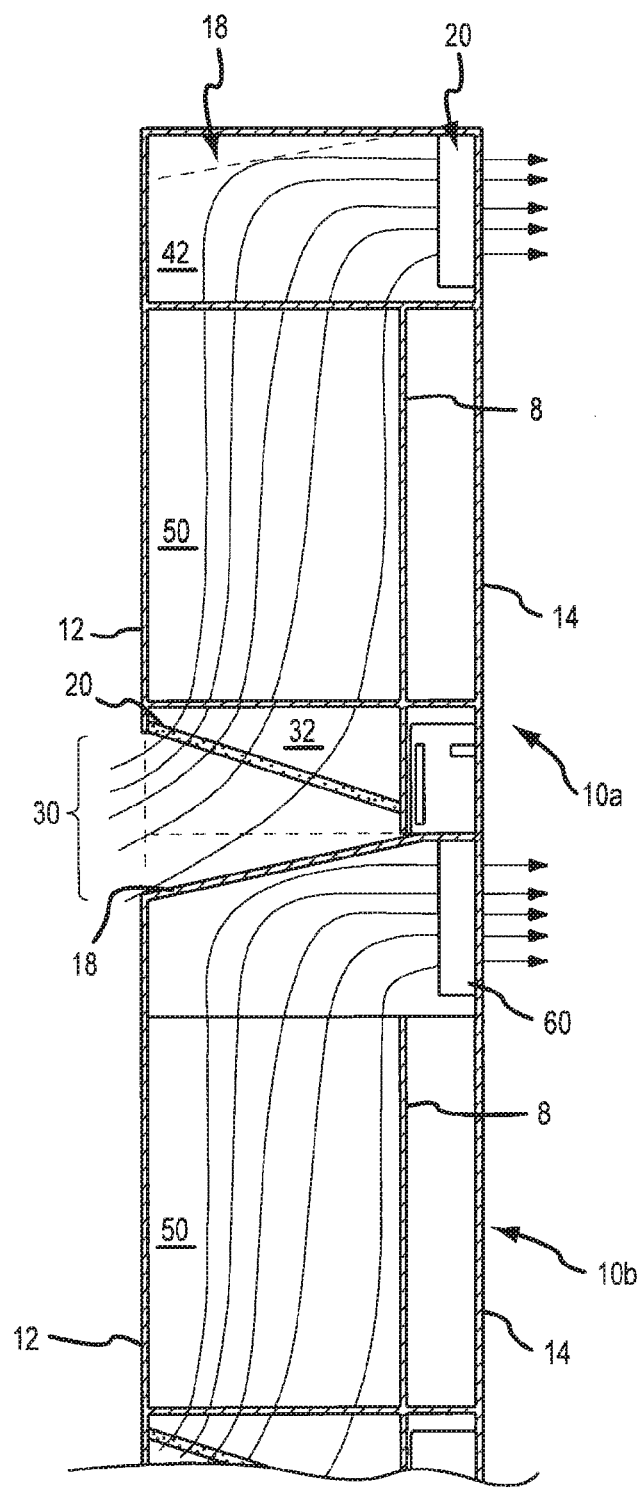
FIG. 7 is a cut-away side view of portions of another embodiment of stacked electronics chassis defining an air inlet having an increased size.

As noted above, the chamfered portion of the top wall 18 permits increase in the cross-sectional area of an air inlet for a chassis disposed there above. As illustrated above, the chamfered portion 18b is formed of an angled surface interconnected to the horizontal portion 18 of the top wall. However, it would be appreciated that other embodiments of top walls having a chamfered portion are possible and are within the scope of the present invention. For instance, FIG. 6 illustrates a top wall 18 having a horizontal portion 18a and a curved chamfered portion 18b. FIG. 7 illustrates another embodiment of a chassis wherein the top wall 18 is sloped between the back wall and the front wall of the chassis 10. In this embodiment, the top wall does not include a horizontal portion. However, the use of the sloped top wall 18 again permits the increased cross-sectional area of an air inlet for chassis disposed there above. In this regard, it will be appreciated that any top wall configuration that allows for increasing the cross-sectional area of an air inlet of a chassis disposed there above is considered within the scope of the present invention. It will be further appreciated that the configurations of FIGS. 6 and 7 may also utilize any appropriate fan configuration such of those illustrated in FIGS. 2 through 3 as well as additional and/or different configurations.

Any other combination of all the techniques discussed herein is also possible. This may include, without limitation, having the inlet at the rear and the outlet at the front, using sloped and curved surfaces in the vicinity of the air outlet to increase airflow, and having a bottom wall but no top wall.

The foregoing description has been presented for purposes of illustration and description. Furthermore, the description is not intended to limit the invention to the form disclosed herein. While a number of exemplary aspects and embodiments have been discussed above, those of skill in the art will recognize certain variations, modifications, permutations, additions, and sub-combinations thereof. It is therefore intended that the following appended claims and claims hereafter introduced are interpreted to include all such variations, modifications, permutations, additions, and sub-combinations as are within their true spirit and scope.

The invention claimed is:

1. An electronics chassis for housing a plurality of electronics boards comprising:
   the chassis, having a front wall, a back wall, first and second lateral sidewalls, and a top wall extending over a portion of the area defined by the front wall, the back wall and the first and second lateral sidewalls; the chassis including an enclosure adapted to house a plurality of electronics boards;
   a lower plenum disposed in the chassis below the enclosure, the lower plenum having a height defined by the vertical distance between the bottom of the enclosure and the bottom of the first and second lateral chassis sidewalls having an air inlet defined by an opening below the lower edge of the front wall of the enclosure and an opening below the lower plenum extending from a plane defined by the front wall toward the back wall that is free of a bottom wall; and
   an upper plenum disposed in the chassis above the enclosure and extending from the front wall to the back wall, the upper plenum including:
      a rear surface associated with the back wall of the enclosure, the rear surface including an air outlet;
      a chamfered surface associated with the from wall of the enclosure; and
      a top surface extending between the rear surface and the top of the chamfered surface;
   wherein when the chassis is disposed on top of a like configured chassis, an opening into the lower plenum defined by the lower edge of the front wall and a chamfered surface of the like configured chassis has a minimum cross-sectional area that is greater than a cross sectional area of a height, as measured in the plane defined by the front wall and width of the lower plenum of the chassis.

2. The chassis of claim 1, wherein the chamfered surface is transverse to both the front wall and the top surface.

3. The chassis of claim 1, wherein the lateral sidewalls of the enclosure form the sidewalls of the upper plenum.

4. The chassis of claim 1, wherein the back wall of the enclosure forms the rear surface of the upper plenum.

5. The chassis of claim 1, wherein the chamfered surface extends between the top surface and an upper edge of the front wall of the enclosure.

6. The chassis of claim 5, wherein the chamfered surface is a planar surface.

7. The chassis of claim 1, further comprising:
   at least a first fan unit disposed within at least one of the upper and lower plenums.

8. An electronics chassis system for housing a plurality of circuit boards comprising:
   a lower chassis including:
      a housing having four vertical sidewalls including first and second lateral sidewalls, a back wall, a front wall and upper and lower plenums, wherein a lower portion of the front wall is removed to define an opening into the lower plenum;
      a top wall;
      a connecting wall that extends between and is transverse to the front wall of the chassis and the top wall of the chassis, wherein the chassis is at least partially free of a bottom wall; and
      one or more fans disposed in the upper plenum vertically disposed proximate to the back wall;
   an upper chassis disposed on top of said lower chassis, including:
      a housing having four vertical sidewalls including first and second lateral sidewalls, a back wall, a front wall and upper and lower plenums, wherein a lower portion of the front wall is removed to define an opening into the lower plenum;
      a top wall; and
      a connecting wall that extends between and is transverse to the front wall of the chassis and the top wall of the chassis, wherein the chassis is free of a bottom wall above the connecting wall of the first chassis, and
      one or more fans disposed in the upper plenum vertically disposed proximate to the back wall;
   wherein the opening into the lower plenum defined by the opening in the front wall of the upper chassis and the connecting front wall of the lower chassis has a minimum cross-sectional area that is greater than a cross-sectional area of a height, as measured in a vertical plane defined by the front wall of the upper chassis, and width of the lower plenum of the upper chassis.

* * * * *